United States Patent [19]

Yamaguchi et al.

[11] Patent Number: 4,865,877
[45] Date of Patent: Sep. 12, 1989

[54] METHOD FOR ROUGHENING CERAMIC SUBSTRATE SURFACE AND METHOD FOR MANUFACTURING PRINTED CIRCUIT BOARD USING SURFACE-ROUGHENED CERAMIC SUBSTRATE

[75] Inventors: Noboru Yamaguchi; Satoru Ogawa; Susumu Kajita; Izuru Yoshizawa; Kiyotaka Waki; Masayuki Ishihara, all of Kadoma, Japan

[73] Assignee: Matsushita Electric Works, Ltd., Osaka, Japan

[21] Appl. No.: 113,125

[22] Filed: Oct. 27, 1987

[30] Foreign Application Priority Data

Nov. 8, 1986 [JP] Japan ................... 61-266265

[51] Int. Cl.$^4$ ............................ B05D 5/12
[52] U.S. Cl. ....................... 427/98; 427/96; 427/443.1; 427/305
[58] Field of Search ............ 427/96, 98, 443.1, 305; 423/321 R

[56] References Cited

U.S. PATENT DOCUMENTS

| | | | |
|---|---|---|---|
| 3,296,012 | 1/1967 | Stalencker | 427/305 |
| 4,104,421 | 8/1978 | Maher | 427/96 |
| 4,316,920 | 2/1982 | Brown | 427/96 |
| 4,448,804 | 5/1984 | Amelio | 427/98 |
| 4,563,217 | 1/1986 | Kikuchi | 427/443.1 |
| 4,574,094 | 3/1986 | DeLuca et al. | 427/96 |
| 4,604,229 | 8/1986 | DeLuca et al. | 429/98 |
| 4,666,744 | 5/1987 | DeLuca | 427/98 |
| 4,684,512 | 8/1987 | Stewart | 423/321 |
| 4,696,851 | 9/1987 | Pryor | 427/97 |

FOREIGN PATENT DOCUMENTS

| | | | |
|---|---|---|---|
| 109015 | 5/1984 | European Pat. Off. | 427/98 |
| 192310 | 8/1986 | European Pat. Off. | 427/98 |
| 117299 | 9/1980 | Japan | 427/98 |
| 149814 | 9/1982 | Japan | 423/321 R |
| 140195 | 6/1986 | Japan . | |

OTHER PUBLICATIONS

Warren L. McCabe and Julian C. Smith "Unit Operations of Chemical Engineering" McGraw-Hill, 2nd ed., 1967, p. 540.
Chemical Abstract 105:196165 vol. 105, 1986, p. 323.

*Primary Examiner*—Shrive Beck
*Assistant Examiner*—Vi Duong Dang
*Attorney, Agent, or Firm*—Burns, Doane, Swecker & Mathis

[57] ABSTRACT

A method for roughening a ceramic substrate surface includes a step of sequentially taking out part of roughening a treatment bath of phosphoric acid into which the ceramic substrate is dipped prior to a formation on the substrate of conductor a layer, and subjecting the part of the bath taken out sequentially to regeneration treatment. Any increase in the viscosity due to dehydrating condensation of the roughening bath can be thereby effectively restrained to prolong effective life of the bath. Further, the surface roughened ceramic substrate can be provided thereon with conductor layers smoothly formed by means of a plating and eventually with a circuit pattern as well as a resistor formed on the pattern within an inert gas atmosphere.

33 Claims, 4 Drawing Sheets

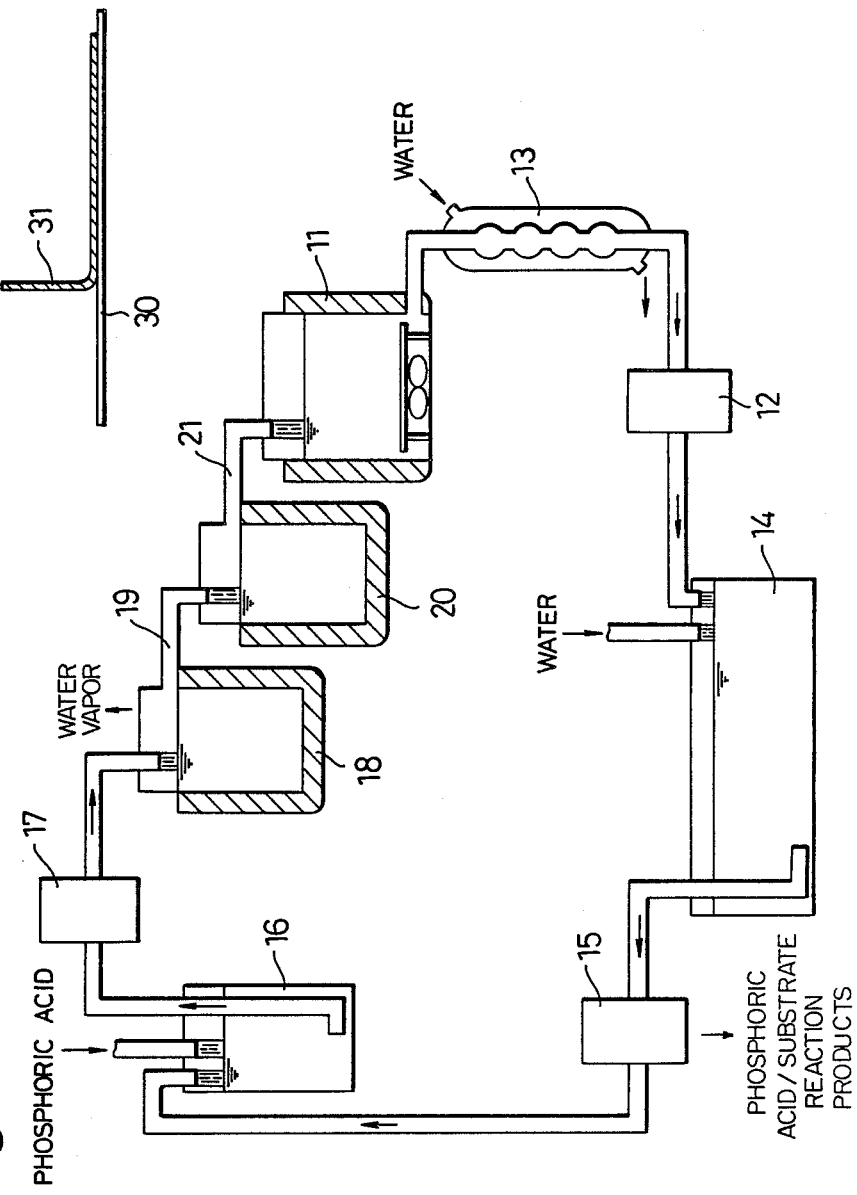

METHOD FOR ROUGHENING CERAMIC SUBSTRATE SURFACE AND METHOD FOR MANUFACTURING PRINTED CIRCUIT BOARD USING SURFACE-ROUGHENED CERAMIC SUBSTRATE

BACKGROUND ART OF THE INVENTION

This invention relates to a method for roughening a ceramic substrate surface and a method for manufacturing a printed circuit board using the surface roughened ceramic substrate.

The ceramic printed circuit board manufactured according to the particular methods is usefully employed as an electronic components.

DISCLOSURE OF PRIOR ART

For the method of preparing in general the ceramic printed circuit board or, in particular, both-surfaces printed circuit board having through holes, there can be mentioned a method in which a conductive paste is applied onto both surfaces of a ceramic substrate to form a circuit pattern by means a of screen and is process printing dried, a resistor paste is applied and dried on both surfaces of the ceramic substrate with the screen printing process, and the entire substrate is sintered in atmosphere. As the conductive paste, it has been necessary to employ a paste of such a noble metal as Au, Ag—Pd alloy and the like which rendered required cost considerably high, and yet the adherability of solder is deteriorated because glass frit is contained in the paste.

Such conductor layers that can be obtained through an electrolytic plating or such gas phase processes as sputtering, vacuum evaporation and the like are known to have the same level of sheet-resistance with pure metals because of the absence of impurity, and to be maintained inexpensive because of capability of their being mass-produced. The conductor layers obtained through the electrolytic plating or gas phase process, however, have suffer from a problem that the adhesion achieved physically between the layer and the substrate is generally insufficient. Here, there has been suggested a method for improving the adhesion of the conductor by means of roughening the substrate surface and subjecting it to a metalization, an anchor effect being obtained when the treatment is utilized.

There have been disclosed in, for example, U.S. Pat. Nos. 4,574,094 and 4,604,299 of Michael A. DeLuca et al methods in which the ceramic substrate is roughened at its surfaces with a molten alkaline metal compound and thereafter a conductor layer is formed on the roughened surfaces by means of a plating process. With such methods, the molten alkaline metal compound corrodes the grain itself of the ceramic substrate to uniformly and finely roughen the ceramic surface, but it has been demanded that the surface roughening be achieved sufficiently in the depth direction of the substrate.

In U.S. Pat. No. 3,296,012 of S. G. Slalnecker, Jr., Japanese Patent Appln. Laid-Open Publication No. 60-46976 and so on, on the other hand, it has been taught to roughen the ceramic substrate surfaces with such acids as phosphoric acid and the like and to adhere thereto the conductor layer, in which event the grain boundary is attacked by the acid to eliminates grains and thus to have the ceramic substrate surface roughened. With the use of, in particular, phosphoric acid, the ceramic substrate surface can be roughened highly efficiently and uniformly, and a sufficiently strong adhesion can be achieved with a remarkably improved anchoring effect. This process has involved, however, such a problem that, in performing the surface roughening by dipping the ceramic substrate in a heated bath of phosphoric acid, a dehydrating condensation takes place in the bath of phosphoric acid as time lapses under heated condition, and thereby the bath is caused to become high in viscosity. When the surface treatment is repeated with respect to the ceramic substrate surface, further, a reaction product between ceramic and phosphoric acid is deposited on the ceramic substrate surface, so that there have arisen such drawbacks that uniform and fine surface roughening cannot be expected any more, the treating bath is caused to be rather shortened in the life of effective use, and so on.

In Japanese Patent Appln. Laid-Open Publication No. 61-140195 of N. Yamaguchi et al, the present inventors, a method for roughening the ceramic substrate surface by means of phosphoric acid is disclosed, but this method has still not been successful in suggesting an effective measure for dealing with the increased viscosity due to the dehydrating condensation of phosphoric acid, and the same drawbacks as in the above are still left unsolved.

There has been a further problem that, when the roughened ceramic substrate surface is provided thereon with conductor layers formed by means of an electroless plating and is then heat treated, such a strain as to cause a blister is yielded between the ceramic substrate and the conductor layers so as to deteriorate the yield of the products, the tendency of which blister generation has been remarkable when a resistor is provided as fired on a circuit pattern of the conductor layers.

SUMMARY OF THE INVENTION

A primary object of the present invention is, therefore, to provide a method for roughening the ceramic substrate surface highly efficiently and uniformly with the use of phosphoric acid to obtain a strong adhesion of the conductor layer with a remarkable anchoring effect, to effectively restrain a deposition of any reaction product between the ceramic substrate and phosphoric acid to have the surface roughening smoothly performed, and to prolong the effective life of use of the treating bath.

According to the present invention, further, a method is provided for allowing excellent ceramic printed-circuit board to be manufactured by restraining the generation of such strain as to cause blisters upon firing a formation of the resistors with respect to the circuit pattern of the conductor layers on the surface roughened ceramic substrate.

According to the present invention, the above object can be realized by providing a method for roughening the ceramic substrate surface by dipping the substrate in a heated phosphoric acid treatment bath or a roughening bath prior to a formation of conductor layers thereon for providing a ceramic printed circuit board, wherein part of the treating bath of phosphoric acid is sequentially taken out of the bath and is sequentially subjected to a regenerating treatment.

Further, an excellent ceramic printed-circuit board with the blister generation effectively restrained can be realized by a method in which, upon formation of the conductor layers on the ceramic substrate surface roughened as dipped in a heated phosphoric acid treatment bath, the conductor layers are provided therein with interstices and subsequent heat treatment is performed within an inert gas atmosphere.

Other objects and advantages of the present invention shall be made clear in the following explanation of the invention detailed with reference to working examples of the invention.

BRIEF EXPLANATION OF DRAWINGS

FIG. 4 is a schematic diagram for explaining a system for working the treating step of FIG. 3;

FIG. 6 is a schematic view for explaining a manner in which the peeling strength of the conductor layer is determined;

While the present invention shall now be explained with reference to different working examples of the invention, it should be appreciated that the intention is not to limit the invention only to the examples disclosed, but rather to include all modifications, alterations and equivalent arrangements possible within the scope of appended claims.

DISCLOSURE OF PREFERRED EXAMPLES

Figure 1:
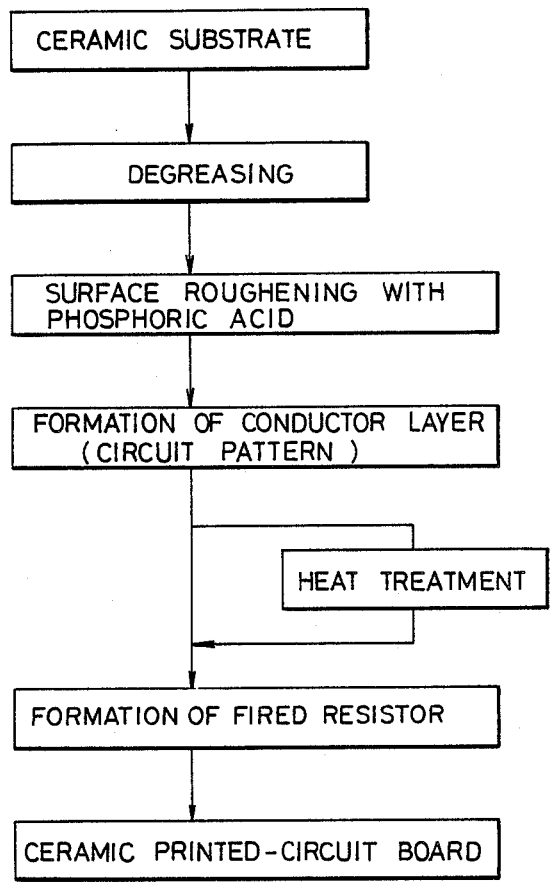
FIG. 1 shows in a block diagram the overall method for manufacturing the ceramic printed-circuit board according to the present invention.

Referring to FIG. 1 showing the manufacturing steps for the ceramic printed-circuit board according to the present invention, an optimum ceramic substrate is first prepared and, after degreasing its surfaces, the ceramic substrate is dipped in a heated phosphoric acid bath or a roughening bath to roughen the surfaces, during which dipping the bath is partly taken out for a regenerative treatment performed in sequential manner so as to maintain the phosphoric acid bath in a steady state. A catalyst for an electroless plating is then provided onto the roughened surfaces of the substrate, and the electroless plating is carried out to form thereon conductor layers constituting a circuit pattern. In forming the conductor layers, they are provided with interstices so as to be porous. A resistor paste is then applied onto the conductor layers of the circuit pattern and is fired within an inert gas atmosphere, and the ceramic printed-circuit board is thereby produced. According to this manufacturing method, the conductive layers are made porous so that, upon heat treatment, in particular, for firing the resistor paste which constitutes a resistor in the printed circuit board, any gas generated within the conductor layers can be discharged to the exterior and thereby any generation of such strain as the blisters due to the generated gas can be prevented. If required, further, the heat treatment may be performed prior to the firing of the resistor.

Next, the method for fabricating the ceramic printed-circuit board shall be partly detailed.

Figure 2:
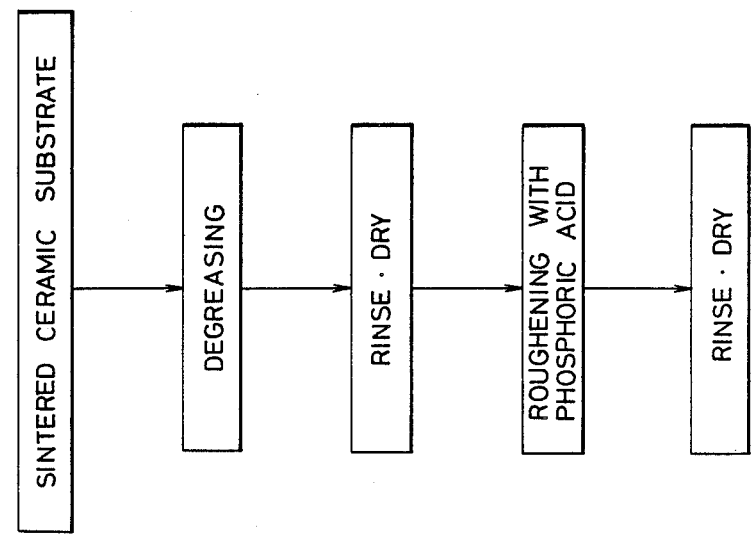
FIG. 2 is a block diagram for explaining one of the substrate treating steps employable in roughening the ceramic substrate surface according to the present invention.

For promoted understanding of the present invention, certain basic matters of techniques for roughening the ceramic substrate surface shall be explained with reference to FIG. 2. Now, a sintered ceramic substrate is prepared first. For ceramic material, it is preferable to use a material selected from such oxides as alumina, forsterite, steatite, zircon, mullite, cordierite, zirconia, titania and the like, but a material selected from carbides or nitrides may also be used, while in particular the substrate of aluminas is the optimum. As the alumina substrate, it is preferable to employ such ones in which $Al_2O_3$ is 92 to 99.5 wt %, $SiO_2$, MgO and CaO are in total 0.5 to 8 wt % and CaO is 0 to 1 wt %. In view of the surface roughening, it is also preferable that the substrate to be employed is of a surface grain size of 1 to 5 $\mu$m. The ceramic substrate is then degreased. For the degreasing, an alkaline detergent, acetone, toluene or the like may be employed, and any grease or dirt on the ceramic substrate surface is removed while the surface is moistened. After the degreasing, the substrate is rinsed and dried to remove any treating agent substantially completely. In this case, the rinse is preferably performed by means of ultrasonic washer with respect to the substrate dipped in a water bath, and the drying is carried out within a drier.

The ceramic substrate is then dipped in a treating bath of phosphoric acid to roughen the surfaces of the substrate. With this surface roughening, an anchoring effect which provides to the conductor layers later formed on the substrate surfaces a strong adhesion can be obtained. For the treating bath of phosphoric acid, it is optimum to employ at least one member selected from a group consisting of orthophosphoric acid, pyrophosphoric acid and metaphosphoric acid which do not lower the adhesion of the conductor layer nor give any influence on any chemically plated metal even when a residue of the acid is present on the substrate surface. The treating bath is preferably kept at a temperature from 250° to 360° C., since the etching ability is lowered below 250° C. and is also lowered above 360° C. due to abruptly increased decomposition and condensation of phosphoric acid. The extent to which the ceramic substrate surface is roughened varies depending on the dipping time in the phosphoric acid bath, but it is preferable to set the dipping time in a range of 1 to 30 minutes, optimally, 3 to 10 minutes. In particular, the phosphoric acid bath is kept in the aluminum concentration to be less than 1 wt %. In this case, the aluminum concentration may be measured by means of, for example, a fluorescent X-ray analysis and represented in a reduced concentration of aluminum contained in the bath. Further, it is desired that the phosphoric acid bath is so controlled that the concentration of polyphosphoric acid of more than tetraphosphoric acid of four molecular polymerization with tetramer of phosphoric acid is made less than 5 mol %.

Further, the phosphoric acid bath continuously employed for roughening the surface of the ceramic substrate of aluminas as kept at a temperature in the foregoing range is caused to become gradually turbid white.

Since this is due to a reaction product of aluminum and phosphoric acid produced with alumina content in the substrate reacted with phosphoric acid content and also to crystals of the produced aluminum phosphate separating out so as to cause the roughening ability to be deteriorated, it is also desirable that the control of the phosphoric acid bath is performed for preventing the turbidity from occurring.

It has been known, on the other hand, that even at a temperature below 360° C., a continued use under continued heating of the treating bath of phosphoric acid for roughening the substrate surface causes condensation to occur in the bath to gradually lower the etching ability. According to a remarkable feature of the present invention, there is provided a measure of sequentially treating the bath of phosphoric acid to have it regenerated for keeping the bath in a steady state and achieving constantly a uniform and fine roughening of the ceramic substrate surface.

Figure 3:
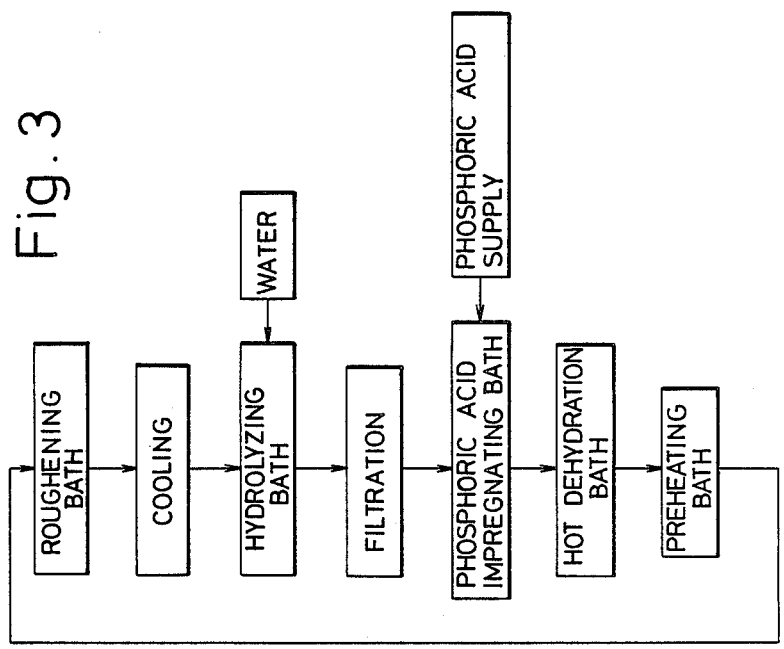
FIG. 3 is a block diagram for explaining a step of treating the bath of phosphoric acid in the method of roughening the ceramic substrate surface according to the present invention.

Referring more in detail to the feature with reference to FIGS. 3 and 4, the treating bath of phosphoric acid in use is partly taken out of a tank of the roughening bath 11 at its bottom for the sequential regeneration treatment through, for example, a chemical pump 12 for high viscosity use, upon which the partial bath taken out is cooled at a cooler 13 so as to cool down the temperature of the bath maintained at, for example, 250°–360° C. down to a temperature in a range of the room temperature to 100° C. or, preferably, 70°–100° C. The thus cooled bath is then led to a hydrolyzing bath 14 to be hydrolyzed preferably with an agitator actuated and water added. The phosphoric acid bath led to this hydrolyzing bath 14 achieves a decomposition and regeneration of condensed phosphoric acid of a higher order than tetraphosphoric acid into orthophosphoric, pyrophosphoric or triphosphoric acid. Here, it is preferable to add water to the condensed phosphoric acid to be at a rate of 0.2 to 0.4 lit. with respect to 1 lit. of the acid, since added water less than this rate renders the agitation to become difficult to be smoothly made to prolong required hydrolyzing time whereas the added water exceeding the rate causes a hot dehydration at a later stage to become time-consuming.

The hydrolyzed phosphoric acid is taken up from the hydrolyzing bath 14 through, for example, a chemical pump 15 having a filter for filtering off any reaction product between phosphoric acid and ceramic substrate, and is led into a phosphoric acid impregnating bath 16, where fresh phosphoric acid is supplied to the thus hydrolyzed and filtered phosphoric acid, so that the amount of phosphoric acid in the bath will be kept constant. It is preferable to provide an agitator also in this impregnating bath 16 to have the content properly agitated in the bath. The thus regenerated phosphoric acid replenished bath is then led through, for example, a chemical pump 17 to a hot dehydration bath 18 to be dehydrated. In this case, the regenerated phosphoric acid is heated in the dehydration bath 18 to be 160° to 240° C. so that the dehydration will be carried out while utilizing the bubbling effect due to water vapor.

Before being returned to the roughening bath 11, if required, the regenerated phosphoric acid bath is subjected to a preheating. To this end, the regenerated acid is led from the hot dehydration bath 18 through an overflow pipe 19 to a preheating bath 20, in which the regenerated acid is heated up to a temperature substantially equal to that in the roughening bath 11, and thereafter the regenerated acid is returned to the roughening bath 11 through an overflow pipe 21. The rate at which the regenerated bath is returned to the bath 11 is set to be substantially equal to the take-out rate from the bottom of the bath 11, the entire regeneration system being so designed.

It should be here appreciated that the incorporation of the foregoing sequential regenerating cycle of the treating phosphoric acid bath into the roughening process for the ceramic substrate surface is effective to maintain the treating bath in the steady active state, so that the surface roughening with respect to the ceramic substrate can be constantly uniformly and finely performed. With respect to the optimumly roughened substrate surfaces, a rinse and dry operation is performed to remove the roughening bath, and thereafter the conductor layer is formed by means of an electroless plating or chemical plating, sputtering, vacuum evaporating or the like process. When the conductor layer is required to be provided as a thick film, an electrolytic plating is further carried out preferably.

EXAMPLE 1

An alumina substrate of alumina content 96 wt % (of a composition of $Al_2O_3$: 96 wt %, CaO: 0.5 wt %, MgO: 1.5 wt %, $SiO_2$:2 wt %; with average surface grain size of 3 to 4 μm) was dipped in the roughening bath for the surface roughening with the substrate surface roughening system shown in FIG. 4. The roughening bath 11 was heated to be at 330° C., the hydrolyzing bath 14 was kept at 80° C., the hot dehydration bath 18 at 230° C. and the preheating bath at 280° C., while the take-out rate from the roughening bath 11, that is, the returning rate of the regenerated bath was set at 20 g/min. Further, the alumina substrate was dipped in the phosphoric acid bath for 5 minutes to carry out sequentially the substrate surface roughening. The bath was maintained in Al concentration to be 0.4 wt % and in phosphoric acid concentration of more than tetraphosphoric acid to be 2 mol %.

Figure 5:
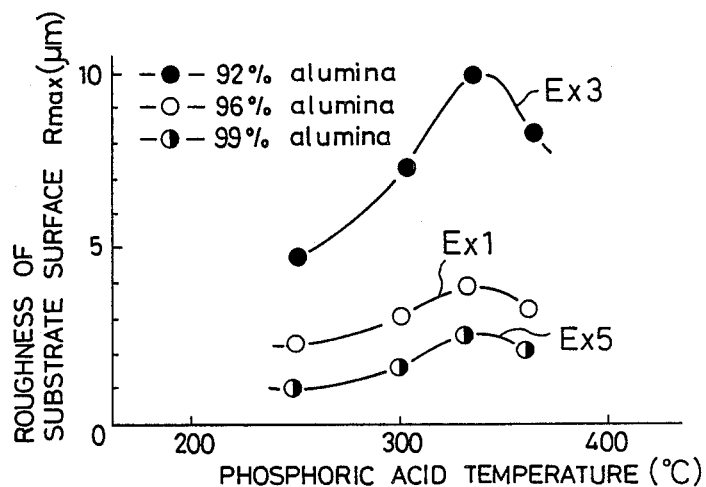
FIG. 5 graphically shows, for three different alumina substrates, the relationship between roughness of the substrate surface and the temperature of the treating phosphoric acid bath.

Lost weight and surface roughness ($R_{max}$) of the alumina substrate thus treated were measured, and the lost weight was in average $1.85 \times 10^{-3}$ g/cm$^2$ with a fluctuation of $\pm 0.05 \times 10^{-3}$ g/cm$^2$, while the surface roughness was in average 4.0 μm with a fluctuation of less than $\pm 1.0$ μm. A copper conductor layer was formed on the surface roughened alumina substrate through a known electroless plating, and an electrolytic copper plating was further carried out on the previously formed layer to form a thick-film copper conductor layer of 35 μm. In addition, the temperature of the roughening bath 11 was properly varied, the surface roughness of the alumina substrate was measured, and the results were as shown by a curve Ex1 in FIG. 5. The peeling strength upon pulling up the copper conductor layer 31 in vertical direction with respect to the alumina substrate 30 as shown in FIG. 6 was then measured, and the result was in average 1.4 kg/cm with a fluctuation restrained to be less than $\pm 5$ wt %.

Figure 7:
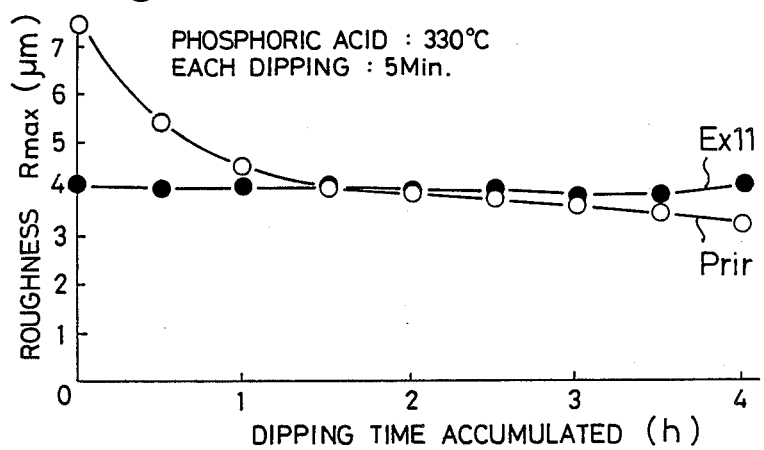
FIG. 7 shows graphically the relationship between the treating time with phosphoric acid and the roughness of the substrate surface in comparison of the method of the present invention with a conventional method.

Next, the roughening phosphoric acid bath was subject to sequential dippings of the alumina substrates, with each dipping carried out for 5 minutes, and the surface roughness achieved with respect to every substrate was measured, respective results of which for these substrates were plotted in accordance with the time elapsed by the dipping of every substrate during the use of the bath, as shown by a curve "Ex11" in FIG. 7. As will be clear when compared with the other curve "Prir" showing measurements for alumina substrates similarly roughened through a conventional batch process, it has been found that a fine surface roughness was uniformly achieved during the sequential use of the bath for a long time.

EXAMPLE 2

The roughening of the alumina substrate surface (composition being $Al_2O_3$: 96 wt %, CaO: 0.5 wt %, MgO: 2 wt %, $SiO_2$: 1.5 wt %; with average surface grain size of 2 to 3 $\mu$m) was carried out through the same system as in EXAMPLE 1, with the phosphoric acid bath (maintained in Al concentration 0.7 wt % and more than tetraphosphoric acid concentration 1 mol %) heated at 300° C., hydrolyzing bath at 70° C., hot dehydrating bath at 240° C. and preheating bath at 260° C., with the regeneration flow rate of 10 g/min., and with the dipping for 6 minutes of the alumina substrate of 96 wt % alumina content in the phosphoric acid bath, and the same measurements were made, according to which the average weight loss was $1.75 \times 10^{-3}$ g/cm$^2$ with a fluctuation of $\pm 0.05 \times 10^{-3}$ g/cm$^2$, while the average surface roughness was 3.5 $\mu$m with a fluctuation of less than $\pm 1.0$ $\mu$m. A copper conductor layer of 35 $\mu$m thick was formed in the same manner as in EXAMPLE 1 and the peeling strength was measured with respect to the layer, results of which has shown an average value of 1.2 kg/cm with a fluctuation restrained less than $\pm 5$ wt %.

EXAMPLE 3

An alumina substrate of 92 wt % alumina content (composition being $Al_2O_3$: 92 wt %, CaO: 1 wt %, MgO: 2 wt %, $SiO_2$: 5 wt %; with average surface grain size of 4 to 5 $\mu$m) was employed for the surface roughening through the same system with EXAMPLE 1 except for an omission of the preheating bath 20, with the roughening bath (maintained to be in Al concentration 1.0 wt % and more than tetraphosphoric acid concentration 0 mol %) heated to be at 260° C., hydrolyzing bath at 70° C. and hot dehydration bath at 230° C., at the regeneration flow rate of 10 g/min. and with the dipping time of 4 minutes. The same measurements as in EXAMPLE 1 were obtained, results of which have shown that the average weight loss was $2.35 \times 10^{-3}$ g/cm$^2$ with a fluctuation of $\pm 0.1 \times 10^{-3}$ g/cm$^2$ and the average surface roughness was 5.0 $\mu$m with a fluctuation of $\pm 1.0$ $\mu$m. A 35 $\mu$m thick copper conductor layer formed in the same as in EXAMPLE 1 was subjected to the peeling strength test and the result was 1.5 kg/cm in average with a restrained fluctuation less than $\pm 5$ wt %. The temperature of the phosphoric acid bath was properly varied and resultant changes in the surface roughness was measured for the alumina substrate, the results of which were as represented by a curve "Ex3" in FIG. 5.

EXAMPLE 4

A forsterite substrate having surface grain size of 4 to 5 $\mu$m was subjected to the surface roughening through the same system with EXAMPLE 1 under the same conditions as in EXAMPLE 3, i.e., with the omission of the preheating bath 20, except that the temperature of the phosphoric acid bath (more than tetraphosphoric acid concentrations substantially zero) was kept at 270° C., and the same measurements as in EXAMPLE 1 were made, the results of which an average weight loss of $3.8 \times 10^{-3}$ g/cm$^2$ with a fluctuation of $\pm 0.1 \times 10^{-3}$ g/cm$^2$ and an average surface roughness of 8 $\mu$m with a fluctuation less than $\pm 1.0$ $\mu$m.

EXAMPLE 5

An alumina substrate of 99.5 wt % alumina content (composition being $Al_2O_3$: 99.5 wt %, CaO: 0 wt %, MgO: 0.3 wt %, $SiO_2$: 0.2 %; with average grain size of 1 to 2 $\mu$m) was subjected to the surface roughening through the same system and under the same conditions as in EXAMPLE 1, as well as the same measurements, the results of which were that the average weight loss was $1.3 \times 10^{-3}$ g/cm$^2$ with a fluctuation of $\pm 0.05 \times 10^{-3}$ g/cm$^2$ surface roughness was 2.5 $\mu$m with a fluctuation less than $\pm 0.5$ $\mu$m. A copper conductor layer of 35 $\mu$m thick was formed in the same manner as in EXAMPLE 1 and the peel strength was measured, the result of which was in average 1.2 kg/cm with a fluctuation restrained less than $\pm 5$ wt %. The surface roughness obtained with properly varied temperatures of the phosphoric acid bath (retaining Al and more than tetraphosphoric acid concentrations to be 0.4 wt % and 2 mol %) were measured and such results as represented by a curve "EX5" in FIG. 5 was obtained.

COMPARATIVE EXAMPLE 1

The same alumina substrate of 96 wt % alumina content as in EXAMPLE 1 (composition being $Al_2O_3$: 96 wt %, CaO: 0.5 wt %, MgO: 1.5 wt %, $SiO_2$: 2.0 wt %; with average surface grain size of 3 to 4 $\mu$m) surface roughened with the roughening bath in conventional batch process and heated at 330° C., and the same measurements as in EXAMPLE 1 were carried out, results obtained through which were as represented by a curve "Prir" in FIG. 7, showing that a remarkable difference was seen in the surface roughness from the time of initiation of the treatment to a time after 1 hour elapsed. A copper conductor layer of 35 $\mu$m thick was formed in the same manner as in EXAMPLE 1, and the peel strength was measured, the result of which has shown that the measurement fluctuation was so large as to be 40% at the most, and no uniform adhesion could be obtained.

According to another feature of the present invention, there can be provided a measure for preventing any defective product from being involved due to blisters yielded between the ceramic substrate and the conductor layer upon heat treatment after the conductor layer formation with respect to the surface roughened ceramic substrate. To this end, according to the present invention, a printed circuit board of ceramic substrate is manufactured to be provided with sufficient interstices for allowing any internally generated gas upon the heat treatment after the conductor layer formation to permeate therethrough. This manufacturing method shall be referred to in detail in the followings.

To roughen the ceramic substrate surface and to rinse and dry the roughened surface, the same steps as those described with reference to FIG. 2 may be carried out. After the rinse and dry of the roughened surface, further, the ceramic substrate is subjected to an activation treatment so that the surface will act as a catalyst when the electroless plating is performed as a next step. The provision of catalyst in this case should preferably be made by means of a sensitizing activation process of two-pack type with $SnCl_2$ and $PdCl_2$ or a single-pack type catalyst accerelation process, while any other activation process may be effectively employed so long as a catalyst which can have a coating of the electroless plating deposited in the next step.

Thereafter, the electroless plating is formed with respect to the entire surfaces of the ceramic substrate subjected to the activation treatment. With respect to the thus electrolessly plated ceramic substrate, after the circuit formation, a resistor paste is applied and resultant resistor which constitutes a resistor is fired within an atmosphere of an inert gas, in particular, $N_2$ preferably. During this firing, there occurs a vaporization in water content taken into the plated layer during the growth of plated layer, or in a part of the plating bath component. In the well known electroless plating, however, the plating bath contains an additive agent for improving the electrical and mechanical characteristics and the crystal of the plated coating is dense and shows a layer structure with respect to the ceramic substrate surface, so that any pressure rise in the interior of the coating cannot be relieved, that is, any gas component generated due to the vaporization in the coating cannot be discharged to the exterior, and thus the blister is likely to occur between the ceramic substrate and the coating of conductor layer. In order to prevent this blister from occurring, in the present invention, the electrolessly plated conductor layer itself is provided with a function of quickly releasing the gas component due to the evaporation. That is, according to the present invention, the electrolessly plated coating is made to be at least one of grain, spherical and pillar structures, so that the plated coating will have a porous structure and be permeable to gas, that is, the conductor layer is made to be in a state having interstices in its thickness direction. It should be appreciated that the porosity of the coating is of an extent at the upper limit of which the resist employed for forming the circuit pattern at the next step is not allowed to pass through the crystal structure upon application or removal of the resist, since any resist present as having penetrated through the plated coating may be a gas generation source and, in addition, may adversely affect to the circuit pattern formation or to any other electric characteristics.

Next, an electrolytic plating may be performed with respect to the ceramic substrate having the thus formed coating including the interstices so that the conductor layer of a desired thickness will be obtained. When it is possible to obtain the conductor layer of desired thickness through the electroless plating, the further step of the electrolytic plating may of course be omitted. In any event, the electrolytically formed conductor layer is generally high in the density and cannot allow any gas component generated upon the heat treatment to penetrate through the layer, and should preferably be limited to be of the minimum required. When, on the other hand, the circuit pattern is not required to be extremely fine but may rather be rough, the electrolytic plating requiring a shorter deposition time than the electroless plating may be advantageously employed in quickly forming the conductor layer, since the layer can be made porous without using the additive agent but with the current density made higher.

References shall now be made with reference to an etching formation of the printed circuit pattern by means of, preferably, subtractive process performed with respect to a ceramic substrate on which the porous conductive layer is formed entirely over the substrate surfaces by means of the electroless plating and, if required, further the electrolytic plating. For the resist required for the etching, any one of liquid type, dry film type and paste type resists should be employed depending on required line width. After the etching, the substrate is subjected to a rinse, the resist is then removed, and the substrate is further rinsed again and dried.

When the porosity of the conductor layers forming the printed circuit pattern on the ceramic substrate is insufficient, the layers are subjected to a heat treatment. For this purpose, the substrate is exposed to a heat gradually raised, preferably at such a relatively slow rate of temperature rise as less than 200° C./min, and the heat treatment is performed in an inert gas atmosphere at a temperature of 500° to 1,083° C., so as to discharge any gas source out of the conductor layers. Though the conductor layers are insufficient in the porosity, they are not much dense as in the conventional products, and the gas source can be removed without causing any blister yielded in the layers.

Through the above treating steps, there can be obtained a printed circuit board having a predetermined circuit pattern. In this case, the conductor layers provided with the porosity never deteriorate the electric characteristics since the copper coating is recrystallized during the foregoing heat treatment or the firing of the resistor, so as to be dense enough. In forming the printed circuit pattern, further, it may be possible to employ, other than the subtractive process, either the additive or semi-additive process.

EXAMPLE 6

Alumina substrates of 96 wt % alumina content (composition being $Al_2O_3$: 96 wt %, CaO: 0.2 wt %, MgO: 2 wt %, $SiO_2$: 1.8 wt %; with average surface grain size of 2 to 3 μm) were dipped in the roughening bath heated at 300°–360° C. for 2 to 5 minutes to roughen their surfaces, so as to be of two different surface roughness of 5 μm and 10 μm, respectively. They were subjected to a hot rinse and to a further rinse in an ultrasonic washer and, thereafter, a catalyst of Pd was provided to the substrate surfaces by means of the sensitizing activation process of two-pack type with $SnCl_2$ and $PdCl_2$. Then, a high speed electroless plating was performed with respect to the substrate with a plating bath of a basic composition of Cu, EDTA, NaOH and HCHO and containing no additive agent. In this case, the plating bath was kept at 60° C. with Cu concentration fixed at 2.5 g/lit. while set values of HCHO and NaOH concentrations were varied to prepare four different plating baths, with a load factor set to be 1 $dm^2$/lit. and the plating was performed to obtain a conductor-layer of 15 μm thick. During such plating, the Cu, HCHO and NaOH concentrations were held as fixed at the set values by means of an automatic concentration controller.

The alumina substrates thus subjected to the plating were then hot rinsed sufficiently and further rinsed with water, and they were dried at a temperature of 80° to 100° C. for 10 to 60 minutes. A circuit pattern was then formed onto the alumina substrates having the thus plated conductor layer by means of a photographic printing with a photosensitive liquid resist. In this case, no heat treatment for removing the gas source was performed.

The thus perpared printed-circuit alumina boards were directly inserted in a muffle furnace held at 1,000° C. within $N_2$ atmosphere and heat treated for 10 minutes. Blister occurring state was observed and its results were as shown in TABLE 1.

The copper conductor layers obtained in the present Example have shown commonly the grain crystal structure, and no resist soaked into the conductor layer could be seen. In the present instance, it has been found that samples having no blister yielded were the ones for which the pH and HCHO concentration were set relatively so high as to be 12.5 and 1.5 g/lit. respectively, to have deposition rate accelerated, and that the ones showing a higher surface roughness were rather advantageous.

With respect to the printed circuit boards prepared under the conditions for the samples in which no blister was yielded, resistors were formed in practice through the screen process with a resistor paste of a type to be fired within a nitrogen atmosphere and was fired at a temperature of 850° to 900° C., and an excellent hybrid circuit substrate was obtained, in which no blister yielded was observed either in the conductor parts or overlapping part of the conductor and employed resistor. Further, by the heat treatment at 850° to 900° C., the copper coating has been caused to recrystallize so as to become more dense, and an improvement in the conductivity could be achieved by about 20% as compared with those before being heat treated.

EXAMPLE 7

Alumina substrates of 96 wt % alumina content (composition being $Al_2O_3$: 96 wt %, CaO: 1 wt %, MgO: 2 wt %, $SiO_2$: 1 wt %; with average surface grain size of 4 to 5 $\mu$m) were degreased, dipped in a saturated sodium hydroxide solution, and sodium hydroxide was applied to surfaces of the alumina substrates. Water was evaporated within a drier kept at a temperature of 80° to 100° C., the dried substrates were then heat treated for 10 to 20 minutes within an electric furnace kept at a temperature of 400° to 450° C., and the alumina substrates of three different surface roughness of 5 $\mu$m, 10 $\mu$m and 15 $\mu$m were obtained. These alumina substrates were hot rinsed and sequentially rinsed sufficiently by means of an ultrasonic washer, and the thus rinsed substrates were neutralized with 10% hydrochloric acid solution.

Next, with the sensitizing activation process of two-pack type of $SnCl_2$ and $PdCl_2$ employed, the alumina substrate surfaces were provided with Pd catalyst and then a high speed electroless copper plating was performed. The plating was performed with four different plating baths including one of the same basic composition of Cu, EDTA, NaOH and HCHO as in EXAMPLE 6 and without any additive, one in which a 2,2'-dipyridyl additive is added to the basic composition, one in which a sodium cyanide additive is added to the basic composition, and one in which 8-acetoxy-quinoline additive was added to the basic composition. For the plated coating growth, after building the baths, the alumina substrates provided with the catalyst were dipped into the baths, while leaving the concentration of the basic composition as naturally decreased due to depositing reaction, with a load factor set to be 0.5 to 3 $dm^2$/lit. and the temperature to be 50° to 70° C., and the coating thickness was made to be 15 $\mu$m. The coating thickness was further increased, after restoring the initial concentration of the plating baths, by dipping again the substrates into these baths and repeating this operation, while setting each dipping time to be 2 to 3 hours. While the substrates were dipped, the baths were properly agitated.

The alumina substrates the plating for which has been completed were hot rinsed sufficiently and again rinsed with water, and they were dried at a temperature of 80° to 100° C. for 10 to 60 minutes. With respect to these alumina substrates having the plated conductor layers, a circuit pattern was formed with a photosensitive liquid resist. Here, the heat treatment for removing any gas source was not performed.

The alumina printed-circuit boards prepared through the foregoing steps were directly inserted into a muffle furnace of $N_2$ atmosphere kept at 1,000° C. and heat-treated for 10 minutes. After this heat treatment, the state of blister occurrence in these printed-circuit boards was observed, the results of which were as shown in TABLE II.

The copper conductor layers obtained through the present EXAMPLE 7 have shown all to be of spherical crystal structure, without involving any blister occurrence. The soaking of resist into the conductor layer was seen in the case where the layer was plated on the alumina substrate having the surface roughness of 15 $\mu$m.

With respect to the alumina printed-circuit boards prepared under the conditions which have not caused the soaking of resist into the conductor layer, a required pattern of the resistor paste of the type of firing in nitrogen atmosphere was printed by the screen printing process and fired at 850° to 900° C., and excellent hybrid circuit substrates could be obtained, in the conductor layers or overlapping parts of the conductor layer and resistors of which no blister was seen to have occurred, and they have shown that the porosity provision to the conductor layers was highly contributive thereto.

EXAMPLE 8

Alumina substrates of 96 wt % alumina content (composition being $Al_2O_3$: 96 wt %, CaO: 0.1 wt %, MgO: 2.1 wt % and $SiO_2$: 1.8 wt %; with average surface grain size of 2 to 3 $\mu$m) chemically surface roughened in the same manner as in EXAMPLE 6 were provided with the Pd catalyst by means of the catalyst acceleration process of single pack type, and the high speed electroless plating was performed with respect to these substrates, employing a plating bath of the basic composition of Cu, EDTA, HCHO and NaOH and a cyanide additive. During the plating, the initial concentrations of Cu, HCHO and NaOH were kept constant to be at set values, while keeping the bath at 50° to 55° C. With the load factor set to be 1 $dm^2$/lit., a conductor of 15 $\mu$m thick was plated.

The thus plated substrates were sufficiently rinsed with hot water and then with water, and were thereafter dried at a temperature of 80° to 100° C. for 10 to 60 minutes. A circuit pattern was then formed on the alumina substrates having the plated conductive layers with a use of the photosensitive liquid resist. The substrates were subjected to a heat treatment performed in $N_2$ atmosphere with a temperature condition of raising the temperature at a rate of 50° to 100° C./h and holding a temperature of 500° to 600° C. for 10 to 60 minutes, and thereby the gas source discharge was performed.

The thus obtained alumina printed-circuit boards through the above steps were directly inserted in the muffle furnace of $N_2$ atmosphere kept at 1,000° C. and were heat treated for 10 minutes, after which the printed-circuit boards were investigated in respect of the state of blister occurrence. Results of this investigation are as shown in TABLE III.

All of the copper conductor layers obtained in the present Example have shown a pillar crystal structure, and there was seen no blister occurrence nor resist soak.

When the resistor paste of the type of nitrogen atmosphere firing was printed by the screen process printing onto the alumina printed-circuit boards obtained through the above steps and was then fired at a temperature of 850° to 900° C., there could be obtained excellent hybrid circuit substrates which have shown that no blister was present at any one of the conductor parts or overlapping parts between the conductor parts and the resistors, and that the provision of porosity to the conductor parts was highly contributive to the blister prevention.

COMPARATIVE EXAMPLE 2

The alumina substrates of 96 wt % alumina content (composition being $Al_2O_3$: 96 wt %, CaO: 1 wt %, MgO: 2 wt % and $SiO_2$: 1 wt %; with average surface grain size of 4 to 5 μm) chemically surface roughened through such two different manners as in EXAMPLES 6 and 7 were provided with the Pd catalyst by means of the two-pack type sensitizing activation process, and were subjected to the high speed electroless copper plating, with two different plating baths, one of which is of the basic composition of Cu, EDTA, NaOH and HCHO with the additive of 2,2'-dipyridyl, and the other of which is of the basic composition with the additive of 8-acetoxy-quinoline. The load factor was set at 1 $dm^2$/lit., the temperature was at 50° to 70° C., and the plated coating layer was made to be 15 μm thick. During the plating, the respective concentrations of Cu, HCHO and NaOH were maintained constant at initially set values by means of the automatic concentration controller.

The thus treated alumina substrates were sufficiently rinsed by hot water and then by water and were thereafter dried at a temperature of 80° to 100° C. for 10 to 60 minutes. A circuit pattern was formed onto the alumina substrates having the plated conductor layers, by means of the photographic printing with the photosensitive resist, upon which formation any heat treatment for removing the gas source was not performed.

These alumina printed-circuit boards prepared through the above steps were directly inserted into the muffle furnace of $N_2$ atmosphere kept at 1,000° C. to be subjected to a heat treatment for 10 minutes. Thereafter, the state of blister occurrence of these substrates was observed, results of which observation were as shown in TABLE IV.

All of the copper conductor layers obtained in this COMPARATIVE EXAMPLE 2 show lamella crystal structure, and it appears that the gas generated inside the conductor layers is not smoothly discharged and a number of blisters have been caused to occur. With respect to the substrates of this Comparative Example, the same heat treatment as in EXAMPLE 8 was performed, but the substrates have not been able to be released from the blister occurrence even when the temperature rising rate was lowered to a large extent.

TABLE I

| Sample No. | Cu Concent. (g/lit.) | HCHO Con. (g/lit.) | pH | Plating Temp. | Surface Rough. | Resist Soak | Blister |
|---|---|---|---|---|---|---|---|
| E6-1 | 2.5 | 1.0 | 12.2 | 60° C. | 5 μm | Absent | Present |
| E6-2 | " | 1.5 | 12.2 | " | " | " | " |
| E6-3 | " | 1.0 | 12.5 | " | " | " | " |
| E6-4 | " | 1.5 | 12.5 | " | " | " | Absent |
| E6-5 | " | 1.0 | 12.2 | " | 10 | " | Present |
| E6-6 | " | 1.5 | 12.2 | " | " | " | Absent |
| E6-7 | " | 1.0 | 12.5 | " | " | " | " |
| E6-8 | " | 1.5 | 12.5 | " | " | " | " |

*Cu and EDTA were made to be of mol ratio 1:2.

TABLE II

| Sample No. | Cu Con. (g/lit) | HCHO Con. (g/lit) | pH | Plat'g Temp. | Surf. Rough. | Additive Con. (g/lit) | Resist Soak | Blister |
|---|---|---|---|---|---|---|---|---|
| E7-1 | 2.5 | 1.5 | 12.5 | 60° C. | 5 μm | — | Absent | Absent |
| 2 | " | " | " | " | 10 | — | " | " |
| 3 | " | " | " | " | 15 | — | Present | " |
| 4 | 2.8 | 4.0 | 12.4 | 55 | 5 | (A) 10 | Absent | " |
| 5 | " | " | " | " | 10 | " | " | " |
| 6 | " | " | " | " | 15 | " | Present | " |
| 7 | 2.6 | 3.5 | 12.5 | 70 | 5 | (B) 10 | Absent | " |
| 8 | " | " | " | " | 10 | " | " | " |
| 9 | " | " | " | " | 15 | " | Present | " |
| 10 | 2.9 | 4.0 | 12.3 | 52 | 5 | (C) 10 | Absent | " |
| 11 | " | " | " | " | 10 | " | " | " |
| 12 | " | " | " | " | 15 | " | Present | " |

*(A) = 8-acetoxy-quinoline
(B) = 2,2'-dipyridyl
(C) = sodium cyanide
*Cu and HCHO concentrations and pH are those upon initiation.
*Cu and EDTA were made to be mol ratio 1:2.

TABLE III

| Sample No. | Cu Con. (g/lit) | HCHO Con. (g/lit) | pH | Plat'g Temp. | Surf. Rough. | Resist Soak | Gas Discharge | Blister |
|---|---|---|---|---|---|---|---|---|
| E8-1 | 2.9 | 4.0 | 12.2 | 50° C. | 5 μm | Absent | Absent | Present |
| 2 | " | " | " | " | 10 | " | " | " |
| 3 | " | " | " | 55 | 5 | " | " | " |
| 4 | " | " | " | " | 10 | " | " | " |
| 5 | " | " | " | 50 | 5 | " | Present | Absent |
| 6 | " | " | " | " | 10 | " | " | " |

TABLE III-continued

| Sample No. | Cu Con. (g/lit) | HCHO Con. (g/lit) | pH | Plat'g Temp. | Surf. Rough. | Resist Soak | Gas Discharge | Blister |
|---|---|---|---|---|---|---|---|---|
| 7 | " | " | " | 55 | 5 | " | " | " |
| 8 | " | " | " | " | 10 | " | " | " |

*Sodium cyanide was added by 10 mg/lit.
*Cu and EDTA were of mol ratio 1:2.

TABLE IV

| Sample No. | Rough'g Agent | Cu Con. | HCHO Con. | pH | Plat'g Temp. | Surf. Rough. | Additive Con. (mg/lit) | Resist Soak | Blister |
|---|---|---|---|---|---|---|---|---|---|
| C2-1 | NaOH | 2.6 | 3.5 | 12.5 | 70° C. | 5 μm | (B) 20 | Absent | Present |
| 2 | " | " | " | " | " | 10 | " | " | " |
| 3 | " | 2.8 | 4.0 | 12.4 | 55 | 5 | (A) 15 | " | " |
| 4 | " | " | " | " | " | 10 | " | " | " |
| 5 | H₃PO₄ | 2.6 | 3.5 | 12.5 | 70 | 5 | (B) 10 | " | " |
| 6 | " | " | " | " | " | 10 | " | " | " |
| 7 | " | 2.8 | 4.0 | 12.4 | 55 | 5 | (A) 10 | " | " |
| 8 | " | " | " | " | " | 10 | " | " | " |

*(A) = 8-acetoxy-quinoline
(B) = 2,2'-dipyridyl
*Cu and EDTA were of mol ratio 1:2.

Figure 8:
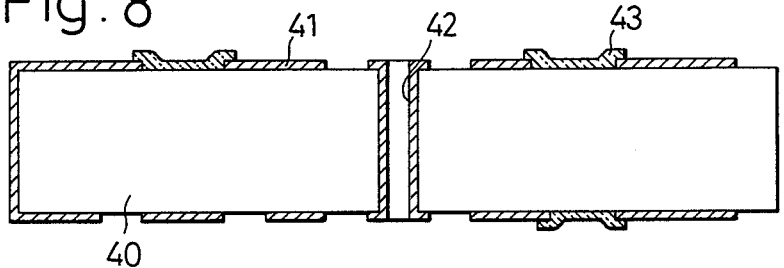
FIG. 8 shows in a sectioned view a printed circuit board obtained according to the present invention.

According to another feature of the present invention, when the method is applied to the both-surface printed-circuit board of ceramic, not only the both surfaces of the ceramic substrate but also peripheral walls of the through-holes can be simultaneously roughened, and thus the through-holes having a high adhesion can be effectively provided to the both-surface printed-circuit board. Referring more specifically to the feature with reference to FIG. 8, the ceramic substrates of various types as have been set forth with reference to FIG. 1 are provided with through holes when they are expected to be made as the both-surface printed-circuit board having the through-holes for connection between the circuits on the both surfaces, through a process of punching ceramic green sheet prior to the sintering of the green sheet to form the ceramic substrate, a process of perforating already sintered ceramic substrate by means of a laser or drilling work or the like process, at any desired positions.

Next, the ceramic substrate having the punched or perforated holes is dipped in the roughening bath as has been described with reference to FIGS. 2 or 3, so that the ceramic substrate surfaces as well as peripheral walls of the holes will be both roughened. The substrate including the holes is then subjected to the plating to form thereon the conductor layers, in which event the conductor layers are preferably rendered to be porous as in the case of the foregoing aspect. In forming the conductor layers, practically, the substrate is provided with the catalyst by means of, for example, the sensitizing and activation process, thereafter the plating resist is applied to the substrate in a pattern reverse to the predetermined circuit pattern, the substrate is then dipped in an electroless plating bath, and the plating is carried out. For the plating, it may be possible to perform the high speed electroless plating with such plating bath of the basic composition of Cu, EDTA, NaOH and HCHO as in the foregoing aspect until the conductor layer of a predetermined thickness is obtained, or to additionally perform the electrolytic plating onto the conductor layer preliminarily formed through the electroless plating, if so required. The ceramic substrate roughened at both of the outer surfaces and the inner peripheral surfaces of the perforated holes is thus provided with the plated conductor layers on all of these roughened surfaces, and the through-holes 42 are simultaneously formed with the formation of the conductor layers 41 on the outer surfaces of the ceramic substrate 40.

Next, the resistor paste is applied in a desired pattern with the circuit pattern of the conductor layers 41 by means of the screen printing process or the like, the applied paste is dried and fired, and resistors 43 are thereby formed. For the resistor paste, such one as a mixture made pasty of a resistance material of Sn, LaB₆ system or Ta system nitride or of SrRuO₃ system with glass or organic vehicle or the like containing an oxide of Si, Ca, Al and the like may be properly selected in accordance with the usage. For drying and firing conditions, preferably, the resistor paste is dried at a temperature of 50° to 200° C., and is then heated at a temperature, for example, of 500° to 1,083° C. or optimumly at 600° to 950° C. at which glass frits in the resistor paste melt onto the ceramic substrate. In firing the applied paste, it is preferable that same is performed in an inert gas atmosphere so that the conductive layers will be prevented from being oxidized. When it is required to control the resistance value of the resistors 43, a trimming is performed by means of a laser or sandblasting process. Carrying out repetitively the printing, drying and firing of the resistor paste, it is possible to form the resistors of a predetermined thickness, and the resistance range can be thereby taken to be as wide as demanded.

EXAMPLE 9

An alumina substrate of 96 wt % alumina content (composition being Al₂O₃: 96 wt %, CaO: 0.5 wt %, MgO: 1.5 wt % and SiO₂: 2 wt %; with average surface grain size of 3 to 4 μm) was perforated by means of a laser for providing through-holes of 200 to 400 μm φ. The substrate was then dipped for 5 minutes in a surface roughening bath of 85 wt % orthophosphoric acid heated to be 330° C., to roughen the outer surfaces of the substrate as well as the inner peripheral walls of the perforated holes. The roughened substrate was sufficiently rinsed and dried, and was sequentially dipped into the sensitizing and activation baths to have a medium of palladium nucleated on the substrate surfaces. Thereafter, a plating resist was applied onto both surfaces of the substrate in a pattern reverse to the circuit pattern, the same electroless plating as in EXAMPLE 7 was carried out, and copper conductor layers of 10 μm thick were obtained.

At desired positions of the circuit pattern on the both surfaces of the alumina substrate thus obtained, a resistor paste of $SrRuO_3$ system was applied by means of the screen process printing. The alumina substrate with the applied resistor paste was fired in a nitrogen atmosphere kept at 900° C., and resistors were formed on the substrate. The resistors were finally, trimmed by means of a laser trimmer so that the resistors will have a desired resistance value, and an alumina both-surface printed-circuit board was obtained.

In the thus obtained printed-circuit board, a pull-test (a test for measuring required load for peeling off the conductor layer from the substrate by pulling, for example, a soft copper wire of 0.8 mm$\phi$ soldered vertically to a surface of the conductor layer of 1.5 mm$^2$ wide) performed has proved that the adhesion to the substrate is so high in both of the copper conductive layer and resistors as to be 2.0 to 3.0 kg/mm$^2$, and that the reliability of the through-holes is extremely higher than in the case of any conventional product.

EXAMPLE 10

An alumina green sheet of 96 wt % alumina content in subsequently sintered state (composition being $Al_2O_3$: 96 wt %, CaO: 1 wt %, MgO: 2 wt % and $SiO_2$: 1 wt %; with average surface grain size of 4 to 5 μm) was punched to have holes and sintered, and a sintered alumina substrate having holes of 200 to 400 μm to be used as the through-holes was obtained. This alumina substrate was surface roughened in the same manner as in EXAMPLE 9, subjected to the palladium nucleation and dipped in an electroless plating bath to form 10 μm thick conductor layers. Also through the same steps as in EXAMPLE 9, the substrate was processed to obtain an alumina both-surface printed-circuit board, and excellent results equivalent to those of EXAMPLE 9 were obtained.

EXAMPLE 11

Except that a zirconia substrate was employed, a zirconia both-surface printed-circuit board was prepared through the same steps as in EXAMPLE 9, and excellent results equivalent to those of the Example could be obtained.

EXAMPLE 12

With a sintered aluminum nitride substrate employed, an aluminum nitride both-surface printed-circuit board was obtained through the same steps as in EXAMPLE 9 except that the roughening bath was heated to be 300° C., and excellent results equivalent to those of the Example could be obtained.

EXAMPLE 13

With a sintered aluminum nitride substrate employed, an aluminum nitride both-surface printed-circuit board was obtained through the same steps as in EXAMPLE 10 except for the heating at 300° C. of the roughening bath, and excellent results equivalent to those of the Example could be obtained.

EXAMPLE 14

An alumina substrate of 96 wt % alumina content of identical composition to that in EXAMPLE 9 was dipped for 5 minutes in a roughening bath of 85 wt % orthophosphoric acid heated to be at 330° C., and the substrate was uniformly roughened. The thus roughened substrate was sufficiently rinsed and dried, and, by dipping it in the sensitizing and activation baths, the nucleation of palladium medium was carried out onto the substrate surface. The plating resist was then applied to the alumina substrate surfaces in a pattern reverse to the circuit pattern, and a 10 μm thick copper conductor layer was formed on the substrate surfaces through the same electroless plating process as in EXAMPLE 7, with the applied resist removed. At desired positions in the circuit pattern thus obtained on the alumina substrate surface, a resistor paste of $SrRuO_3$ was applied by means of the screen printing process, and a resistor was obtained by firing the applied paste in a nitrogen atmosphere at 900° C. Finally, the resistor was subjected to the trimming by means of the laser trimmer to achieve a desired resistance value, and an alumina printed-circuit board was thereby obtained.

What we claim as our invention is:

1. A method for roughening ceramic substrate surfaces, comprising the steps of dipping a ceramic substrate in a heated phosphoric acid bath prior to a formation of conductor layers on said ceramic substrate surfaces to provide a ceramic printed-circuit board, sequentially taking out phosphoric acid from said bath, hydrolyzing said phosphoric acid to prevent viscosity increase of said bath due to dehydration condensation of said phosphoric acid, and returning the hydrolyzed phosphoric acid to said bath to sequentially regenerate the bath.

2. A method according to claim 1, wherein said phosphoric acid bath is kept at a temperature of 250° to 360° C.

3. A method according to claim 1, wherein said phosphoric acid bath is prevented from becoming turbid white.

4. A method according to claim 1, wherein said dipping of said ceramic substrate into said bath is for 3 to 10 minutes.

5. A method according to claim 1, wherein said phosphoric acid bath is made to maintain its aluminum concentration to be less than 1 wt %.

6. A method according to claim 1, wherein said phosphoric acid is made to maintain its more than tetraphosphoric acid concentration to be less than 5 mol %.

7. A method according to claim 1, wherein said treating step includes a step of hot dehydration.

8. A method according to claim 7, wherein said hot dehydration step is performed substantially at a temperature of 160° to 240° C.

9. A method according to claim 7, wherein said treating step includes a step of hydrolysis.

10. A method according to claim 9, wherein said hydrolyzation step is performed substantially with a hot bath of the room temperature to 100° C.

11. A method according to claim 1, wherein said taking out, treating and returning steps are performed by maintaining a rate at which said phosphoric acid is partly taken out from said bath and a rate at which treated acid is returned to the bath for said dipping to be substantially identical.

12. A method according to claim 1, wherein said treating step is performed in a recirculating cycle of sequentially performed partial acid taking-out, hydrolyzing, fresh phosphoric acid supplying, hot dehydrating and regenerated-bath returning steps.

13. A method according to claim 12, wherein said cycle of recirculation includes a step of cooling said acid taken out prior to said hydrolyzing step.

14. A method according to claim 1, wherein said ceramic substrate is an alumina substrate having a grain size of 1 to 5 μm.

15. A method according to claim 1, wherein said ceramic substrate is an alumina substrate of a composition of 92 to 99.5 wt % of $Al_2O_3$, and 0.5 to 8 wt % in the sum of CaO, MgO and $SiO_2$, in which CaO being 0 to 1 wt %.

16. A method for manufacturing a ceramic printed-circuit board, comprising the steps of dipping a ceramic substrate in a surface roughening bath to roughen surfaces of said substrate prior to forming conductor layers on said surfaces for providing said ceramic printed-circuit board, and forming said conductor layers by means of an elctroless plating while providing to the layers exteriorly communicating interstices in thickness direction of the layers, thereby to permit discharge of any gases generated during subsequent heat treatment of said board.

17. A method according to claim 16, wherein said surface roughening bath is of phosphoric acid.

18. A method according to claim 16, wherein said ceramic substrate having said conductor layers is subjected to a heat treatment.

19. A method according to claim 18, wherein said heat treatment is carried out substantially at 500° to 1,083° C.

20. A method according to claim 16, wherein said conductor layers are formed to have at least one of grain, spherical and pillar crystal structures.

21. A method according to claim 17, wherein said surface roughening bath is heated substantially at 250° to 360° C.

22. A method according to claim 16, wherein said surface roughened ceramic substrate is subjected to an activation treatment to act as a catalyst.

23. A method according to claim 22, wherein said activation treatment is performed by a sensitizing activation process of two-pack type.

24. A method according to claim 22, wherein said activation treatment is performed by a catalyst acceleration process of a single-pack type.

25. A method according to claim 20, wherein said electroless plating is carried out with a plating bath of a basic composition of Cu, EDTA, NaOH and HCHO.

26. A method for manufacturing a ceramic both-surface printed-circuit board, comprising the steps of dipping a ceramic substrate in a heated phosphoric acid bath to roughen surfaces of said substrate prior to forming conductor layers on said surfaces for providing a ceramic printed-circuit board, forming a circuit pattern on said roughened substrate by means of an electroless plating performed while providing to said conductor layers exteriorly communicating interstices in thickness direction of the layers, thereby to permit discharge of any gases generated during subsequent heat treatment of said board, and forming predetermined resistors with respect to said circuit pattern.

27. A method according to claim 26, which further comprises a step of forming holes in said ceramic substrate for being used as through-holes, prior to said surface roughening.

28. A method according to claim 26, wherein said step of forming said resistors include steps of applying, drying and firing a resistor paste.

29. A method according to claim 28, wherein said firing of said resistor paste is performed within an inert gas atmosphere.

30. A method according to claim 29, wherein said firing of said resistor paste is performed within a nitrogen atmosphere.

31. A method according to claim 30, wherein said firing of said resistor paste at a temperature at which glass frits contained in the paste melt onto said substrate surface.

32. A method according to claim 26, wherein said firing of said resistor paste is performed substantially at 500° to 1,083° C.

33. A method according to claim 26, wherein said resistor formed with said circuit pattern of said conductor layers is subjected to a trimming into a predetermined resistance value.

* * * * *